United States Patent
Yeo et al.

(10) Patent No.: US 7,839,193 B2
(45) Date of Patent: Nov. 23, 2010

(54) DUTY CYCLE CORRECTION CIRCUITS INCLUDING A TRANSITION GENERATOR CIRCUIT FOR GENERATING TRANSITIONS IN A DUTY CYCLE CORRECTED SIGNAL RESPONSIVE TO AN INPUT SIGNAL AND A DELAYED VERSION OF THE INPUT SIGNAL AND METHODS OF OPERATING THE SAME

(75) Inventors: Hwan-seok Yeo, Seoul (KR); Jin-ho Seo, Seoul (KR); Hong-june Park, Seoul (KR); Jun-hyun Bae, Seoul (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 91 days.

(21) Appl. No.: 12/112,225

(22) Filed: Apr. 30, 2008

(65) Prior Publication Data

US 2008/0272815 A1   Nov. 6, 2008

(30) Foreign Application Priority Data

May 4, 2007   (KR)   ..................... 10-2007-0043567

(51) Int. Cl.
*H03K 3/017* (2006.01)

(52) U.S. Cl. .................................... 327/175

(58) Field of Classification Search ..................... None
See application file for complete search history.

(56) References Cited

U.S. PATENT DOCUMENTS

| 7,292,082 | B2 * | 11/2007 | Nam et al. .................. 327/175 |
| 7,560,963 | B2 * | 7/2009 | Yun et al. .................... 327/158 |
| 2001/0030562 | A1 * | 10/2001 | Kim et al. .................... 327/175 |
| 2005/0007168 | A1 * | 1/2005 | Park et al. .................... 327/175 |
| 2007/0216457 | A1 * | 9/2007 | Agarwal et al. ............. 327/175 |
| 2009/0058481 | A1 * | 3/2009 | Kim et al. .................... 327/175 |

FOREIGN PATENT DOCUMENTS

| KR | 10-0360403 | 10/2002 |
| KR | 10-0366618 | 12/2002 |
| KR | 10-0384781 | 5/2003 |

* cited by examiner

*Primary Examiner*—Lincoln Donovan
*Assistant Examiner*—Khareem E Almo
(74) *Attorney, Agent, or Firm*—Myers Bigel Sibley & Sajovec, P.A.

(57) ABSTRACT

A duty cycle correction circuit is operated by maintaining a state of a duty cycle corrected signal, generating a first transition in the state of the duty cycle corrected signal responsive to an input signal, and generating a second transition in the state of the duty cycle corrected signal responsive to a delayed version of the input signal.

27 Claims, 12 Drawing Sheets

`DUTY CYCLE CORRECTION CIRCUITS INCLUDING A TRANSITION GENERATOR CIRCUIT FOR GENERATING TRANSITIONS IN A DUTY CYCLE CORRECTED SIGNAL RESPONSIVE TO AN INPUT SIGNAL AND A DELAYED VERSION OF THE INPUT SIGNAL AND METHODS OF OPERATING THE SAME`

RELATED APPLICATION

This application claims the benefit of and priority to Korean Patent Application No. P2007-0043567, filed May 4, 2007, in the Korean Intellectual Property Office, the disclosure of which is hereby incorporated herein by reference as if set forth in its entirety.

1. Field of the Invention

The present invention relates generally to integrated circuit devices and methods of operating the same and, more particularly, to duty cycle correction (DCC) circuits, and methods of operating the same.

2. Background of the Invention

Delay locked loop (DLL) circuits are clock recovery circuits for precisely synchronizing the phase of an internal clock with the phase of an external clock and are widely applied in a variety of electronic devices including, but not limited to, the next generation of memories or system integrated circuits, such as synchronous dynamic random access memories (SDRAMs) and/or double data rate (DDR) SDRAMs. FIG. 1 illustrates an example in which an external clock leads an internal clock due to skew introduced as a result of the two clock signals traversing different paths.

To precisely synchronize the phase of an internal clock with the phase of an external clock, a phase synchronization device, such as a phase locked loop (PLL) circuit or a DLL is typically used. Where the frequency of an external clock is different from the frequency of an internal clock, a PLL having a frequency multiplication function may be used. On the other hand, where the frequency of an external clock is about the same as that of an internal clock, a DLL may be used. Unlike a PLL, a DLL, typically, does not have a problem with phase noise accumulating and, thus, may be advantageous in decreasing the jitter of an internal clock. Therefore, where frequency multiplication is not necessary, it is relatively common to generate an internal clock using a DLL.

FIG. 2 is a block diagram of a conventional DLL circuit 100. The DLL circuit 100 includes a phase detector 110, an adjustable delay line 120, a delay control unit (DCU) 130, and a compensation delay unit 140 that are configured as shown. The adjustable delay line 120 generates the output clock signal by delaying the input clock signal for a predetermined time. The adjustable delay line may include, for example, a plurality of delay elements, such as inverter circuits, connected in series. The predetermined time is determined by the DCU 130, which generates a digital code for input to the adjustable delay line 120 in response to an output signal generated by the phase detector circuit 110. If an analog design is implemented, then the DCU 130 may output a voltage for input to the adjustable delay line 120 in response to the output signal generated by the phase detector circuit 110. The phase detector circuit 110 generates the output signal for input to the DCU 130 based on the phase difference between the input clock signal and the output clock signal. A compensation delay unit 140 may be used to connect the output clock to the phase detector circuit 110.

There are limitations on the amount of data that may be input to and/or output from a memory device per cycle of a system clock. To address these limitations, DDR SDRAMs have been recently developed to further increase the transmission speed of data. DDR SDRAMS input and/or output data in synchronization on both the rising edge and the falling edge of a clock.

Reliable data transmission may be possible when the duty cycle of a clock signal is equivalent to 50% (a 50/50 duty cycle) in an integrated circuit memory device, for example, a DDR SDRAM or a direct rambus dynamic random access memory (RDRAM). Thus, when a clock signal having a duty cycle that is greater than or less than 50% is provided as an input, the device may not perform to its potential. Duty cycle correction (DCC) circuits have been developed to address this problem.

For reliable operation internal clocks used in integrated circuit memory devices may be symmetric, i.e., have a duty cycle of about 50%. However, external clocks input into integrated circuit memory devices are typically asymmetric, i.e., the duty cycle is not 50% and may be further distorted by characteristics of the integrated circuit memory device. Duty cycle correction circuits receive external clock signals and generate internal clock signals having duty cycles of about 50%. This is illustrated, for example in FIG. 3 where signal A has a duty ratio of approximately 30%:70%, signal B has a duty ratio of approximately 60%:40%, but signal C has a duty ratio of approximately 50%:50%. Duty cycle correction may be particularly desirable in DDR devices as these devices use both the rising and falling edges of a clock to double the data rate. Clock signals that deviate significantly from an approximately 50% duty cycle may result in insufficient hold times for data transferred on either the rising or falling edge of the clock signal.

Conventional DCC circuits typically use interpolation circuitry in both analog and digital DLL circuits. Unfortunately, such interpolation circuits may be susceptible to process, voltage, and temperature variations for interpolations. Moreover, interpolation circuits may have a relatively large intrinsic delay associated therewith. Such circuits may be limited in the duty ratios that they can generate. For example, duty cycle correction may be limited to approximately 50%:50%. In addition, accuracy may be affected when the distortion in the clock signal (i.e., the deviation from a 50%:50% ratio) is relatively large.

SUMMARY

According to some embodiments of the present invention, a duty cycle correction circuit is operated by maintaining a state of a duty cycle corrected signal, generating a first transition in the state of the duty cycle corrected signal responsive to an input signal, and generating a second transition in the state of the duty cycle corrected signal responsive to a delayed version of the input signal.

In other embodiments, generating the first transition includes generating a first driver input signal responsive to the input signal, and generating the second transition includes generating a second driver input signal responsive to the delayed version of the input signal.

In still other embodiments, generating the first transition further includes changing the state of the duty cycle corrected signal responsive to the first driver input signal, and generating the second transition includes changing the state of the duty cycle corrected signal responsive to the second driver input signal.

In still other embodiments, the method further includes generating a delay control signal and generating the delayed version of the input signal responsive to the delay control signal.

In still other embodiments, generating the delay control signal includes generating the delay control signal responsive to a plurality of phase shifted versions of the input signal.

In still other embodiments, the method further includes generating a delayed version of the input signal using a delay locked loop circuit.

In further embodiments of the present invention, a clock circuit is operated by maintaining a state of a duty cycle corrected signal, generating a first transition in the state of the duty cycle corrected signal responsive to an input clock signal, generating a second transition in the state of the duty cycle corrected signal responsive to a delayed version of the input clock signal, delaying the duty cycle corrected signal to generate an output clock signal, and determining a phase difference between the output clock signal and the input clock signal, wherein the duty cycle corrected signal is delayed based on the determined phase difference to generate the output clock signal.

In still further embodiments, the method further includes generating a delay control signal and generating the delayed version of the input clock signal responsive to the delay control signal.

In still further embodiments, generating the delay control signal includes generating the delay control signal responsive to a plurality of phase shifted versions of the duty cycle corrected signal.

In still further embodiments, generating the first transition includes generating a first driver input signal responsive to the input clock signal, and generating the second transition includes generating a second driver input signal responsive to the delayed version of the input clock signal.

In still further embodiments, generating the first transition further includes changing the state of the duty cycle corrected signal responsive to the first driver input signal, and generating the second transition includes changing the state of the duty cycle corrected signal responsive to the second driver input signal.

In other embodiments of the present invention, a clock circuit is operated by delaying an input clock signal to generate an output clock signal, maintaining a state of a duty cycle corrected signal, generating a first transition in the state of the duty cycle corrected signal responsive to the output clock signal, generating a second transition in the state of the duty cycle corrected signal responsive to a delayed version of the output clock signal, and determining a phase difference between the duty cycle corrected signal and the input clock signal, wherein the input clock signal is delayed based on the determined phase difference to generate the output clock signal.

In still other embodiments, the method further includes generating a delay control signal and generating the delayed version of the output clock signal responsive to the delay control signal.

In still other embodiments, generating the delay control signal includes generating the delay control signal responsive to a plurality of phase shifted versions of the input clock signal.

In still other embodiments, generating the first transition includes generating a first driver input signal responsive to the output clock signal, and generating the second transition includes generating a second driver input signal responsive to the delayed version of the output clock signal.

In still other embodiments, generating the first transition includes changing the state of the duty cycle corrected signal responsive to the first driver input signal, and generating the second transition includes changing the state of the duty cycle corrected signal responsive to the second driver input signal.

In further embodiments of the present invention, a duty cycle correction circuit includes a latch that is configured to maintain a state of a duty cycle corrected signal and a transition generator circuit that is configured to generate a first transition in the state of the duty cycle corrected signal responsive to an input signal, and to generate a second transition in the state of the duty cycle corrected signal responsive to a delayed version of the input signal.

In still further embodiments, the transition generator circuit includes a first pulse generator circuit that is configured to generate a first driver input signal responsive to the input signal and a second pulse generator circuit that is configured to generate a second driver input signal responsive to the delayed version of the input signal.

In still further embodiments, the duty cycle correction circuit further includes a driver circuit that is configured to generate the first transition in the state of the duty cycle corrected signal responsive to the first driver input signal, and to generate the second transition in the state of the duty cycle corrected signal responsive to the second driver input signal.

In still further embodiments, the duty cycle correction circuit further includes a delay control circuit that is configured to generate a delay control signal and an adjustable delay line circuit that is configured to generate the delayed version of the input signal responsive to the delay control signal.

In still further embodiments, the delay control circuit is further configured to generate the delay control signal responsive to a plurality of phase-shifted versions of the input signal.

In still further embodiments, the delay control circuit includes a delay flip-flop that is responsive to a first one of the plurality of phase shifted versions of the input signal at a data input thereof and is responsive to a second one of the plurality of phase shifted versions of the input signal at a clock input thereof and a delay control signal generator circuit that is configured to generate the delay control signal responsive to an output of the delay flip-flop.

In still further embodiments, the delay control circuit includes a plurality of delay flip-flops and the delay flip-flop is a first one of the plurality of delay flip-flops, a second one of the plurality of flip-flops is responsive to the second one of the plurality of phase shifted versions of the input signal at a data input thereof and is responsive to the first one of the plurality of phase shifted versions of the input signal at a clock input thereof, wherein the delay control signal generator circuit is further configured to generate the delay control signal responsive to the output of the first delay flip-flop and an output of the second delay flip-flop.

In still further embodiments, the duty cycle correction circuit further includes a delayed locked loop circuit that is configured to generate the delayed version of the input signal responsive to the input signal.

In other embodiments of the present invention, a clock circuit includes a latch that is configured to maintain a state of a duty cycle corrected signal, a transition generator circuit that is configured to generate a first transition in the state of the duty cycle corrected signal responsive to an input clock signal, and to generate a second transition in the state of the duty cycle corrected signal responsive to a delayed version of the input clock signal, an adjustable delay line that is configured to delay the duty cycle corrected signal to generate a duty cycle corrected output clock signal, and a phase detector circuit that is configured to determine a phase difference between the duty cycle corrected output clock signal and the input clock signal, wherein the duty cycle corrected signal is delayed based on the determined phase difference to generate the duty cycle corrected output clock signal.

In further embodiments of the present invention, a clock circuit includes an adjustable delay line that is configured to delay an input clock signal to generate an output clock signal, a latch that is configured to maintain a state of a duty cycle corrected output clock signal, a transition generator circuit that is configured to generate a first transition in the state of the duty cycle corrected output clock signal responsive to the output clock signal, and to generate a second transition in the state of the duty cycle corrected output clock signal responsive to a delayed version of the output clock signal, and a phase detector circuit that is configured to determine a phase difference between the duty cycle corrected output clock signal and the input clock signal, wherein the input clock signal is delayed based on the determined phase difference to generate the output clock signal.

In other embodiments of the present invention, an integrated circuit device includes a clock circuit that includes a latch that is configured to maintain a state of a duty cycle corrected clock signal and a transition generator circuit that is configured to generate a first transition in the state of the duty cycle corrected clock signal responsive to an input clock signal, and to generate a second transition in the state of the duty cycle corrected clock signal responsive to a delayed version of the input clock signal. The integrated circuit device further includes an internal circuit that is responsive to the duty cycle corrected clock signal.

In still other embodiments, the integrated circuit device is an integrated circuit memory device.

In further embodiments of the present invention, a system includes a clock source that is configured to generate an input clock signal and a memory device that includes a clock circuit. The clock circuit includes a latch that is configured to maintain a state of a duty cycle corrected clock signal and a transition generator circuit that is configured to generate a first transition in the state of the duty cycle corrected clock signal responsive to the input clock signal, and to generate a second transition in the state of the duty cycle corrected clock signal responsive to a delayed version of the input clock signal. The memory device further includes a data storage unit and an input/output circuit that is configured to transfer data between the data storage unit and an external device responsive to the duty cycle corrected clock signal.

In still further embodiments, the memory device is a double data rate memory device.

In other embodiments of the present invention, a system includes a controller circuit and at least one integrated circuit device connected to the controller circuit, the at least one integrated circuit device includes clock circuit. The clock circuit includes a latch that is configured to maintain a state of a duty cycle corrected clock signal and a transition generator circuit that is configured to generate a first transition in the state of the duty cycle corrected clock signal responsive to an input clock signal, and to generate a second transition in the state of the duty cycle corrected clock signal responsive to a delayed version of the input clock signal.

In still other embodiments, the at least one integrated circuit device is an integrated circuit memory device.

In still other embodiments, the memory device is a double data rate memory device.

In still other embodiments, the system comprises a graphics card, a computer, and/or a mobile terminal.

In further embodiments of the present invention, a system, includes a plurality of integrated circuit devices, at least one of the integrated circuit devices includes a clock circuit. The clock circuit includes a latch that is configured to maintain a state of a duty cycle corrected clock signal and a transition generator circuit that is configured to generate a first transition in the state of the duty cycle corrected clock signal responsive to an input clock signal, and to generate a second transition in the state of the duty cycle corrected clock signal responsive to a delayed version of the input clock signal.

In still further embodiments, the system is a memory module and the at least one of the integrated circuit devices is a memory device.

In still further embodiments, the memory device is a double data rate memory device.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
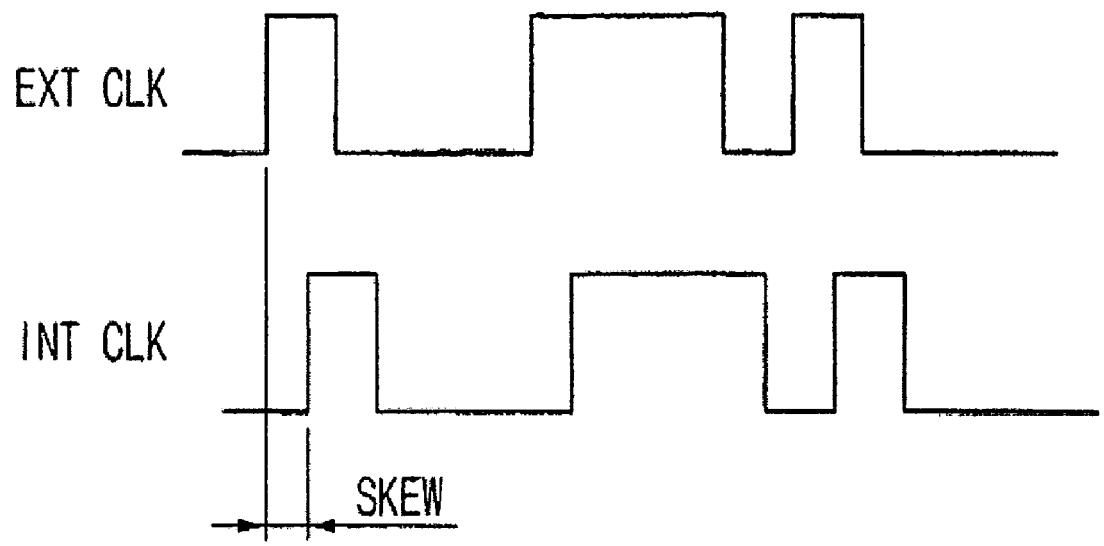
FIG. 1 is a block diagram that illustrates skew between an external clock signal and an internal clock signal.
Figure 2:
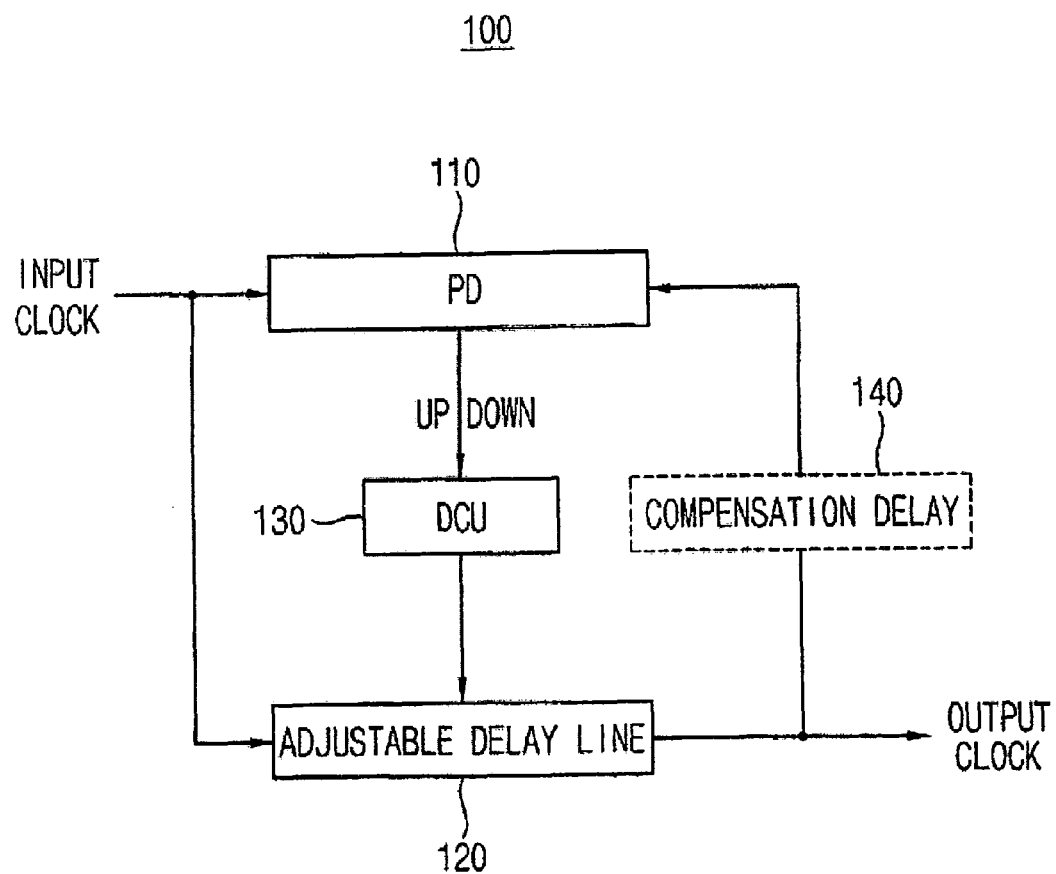
FIG. 2 is a block diagram of a conventional delay locked loop (DLL) circuit.
Figure 3:
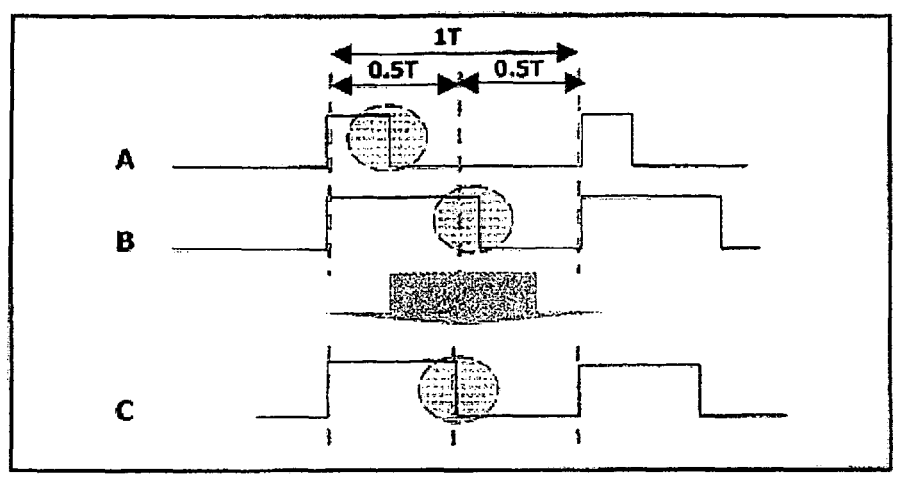
FIG. 3 is a diagram that illustrates duty cycle correction.

While the present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements. As used herein, the term "and/or" and "/"

includes any and all combinations of one or more of the associated listed items. Like numbers refer to like elements throughout the description.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various components, circuits, regions, layers and/or sections, these components, circuits, regions, layers and/or sections should not be limited by these terms. These terms are only used to distinguish one component, circuit, region, layer or section from another component, circuit, region, layer or section. Thus, a first component, circuit, region, layer or section discussed below could be termed a second component, circuit, region, layer or section, and similarly, a second component, circuit, region, layer or section may be termed a first component, circuit, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 4:
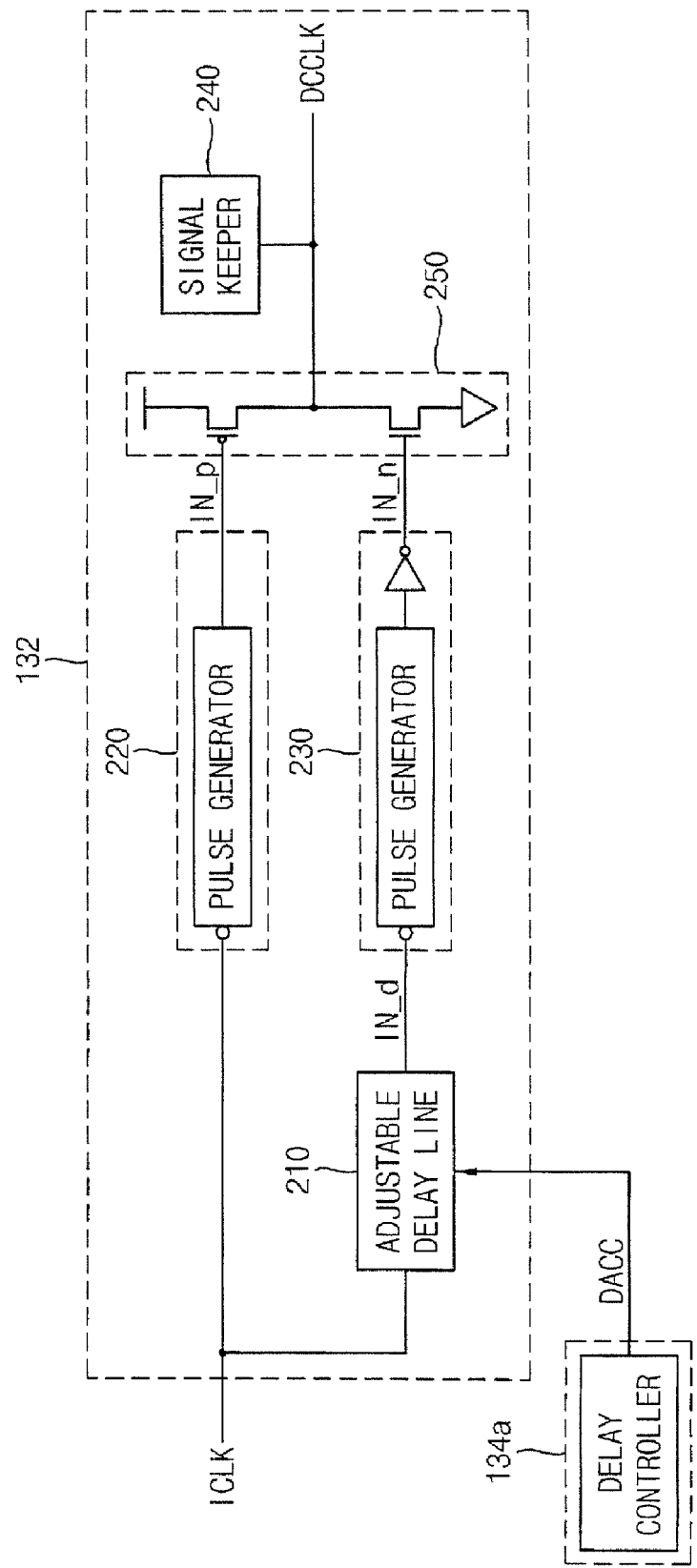
FIG. 4 is a block/circuit diagram that illustrates a Duty Cycle Correction (DCC) or Delay Adjust Unit (DAU) circuit, in accordance with some embodiments of the present invention.

Referring now to FIG. 4, a DCC or Delay Adjust Unit (DAU) circuit 132, according to some embodiments of the present invention, is illustrated. The DCC circuit 132 includes an adjustable delay line circuit 210, a first pulse generator circuit 220, a second pulse generator circuit 230, a driver circuit 250, and a signal keeper/latch circuit 240 that are configured as shown. The DCC circuit 132 receives as an input an input signal, such as an input clock signal ICLK. The first pulse generator circuit 220 is configured to generate a first driver input signal IN_p responsive to the input clock signal ICLK. The second pulse generator circuit 230 is configured to generate a second driver input signal IN_n responsive to a delayed version of the input clock signal ICLK. The driver circuit 250 comprises a PMOS and an NMOS transistor, which are configured as shown, and is configured to generate a first transition in the state of a duty cycle correct signal DCCLK, which is held by the latch circuit 240, responsive to the first driver input signal and to generate a second transition in the state of the signal DCCLK responsive to the second driver input signal. A delay control unit 134a may be used to generate a delay control signal DACC, which is used to drive the adjustable delay line circuit 210 to generate the delayed version of the input clock signal ICLK.

Figure 5:
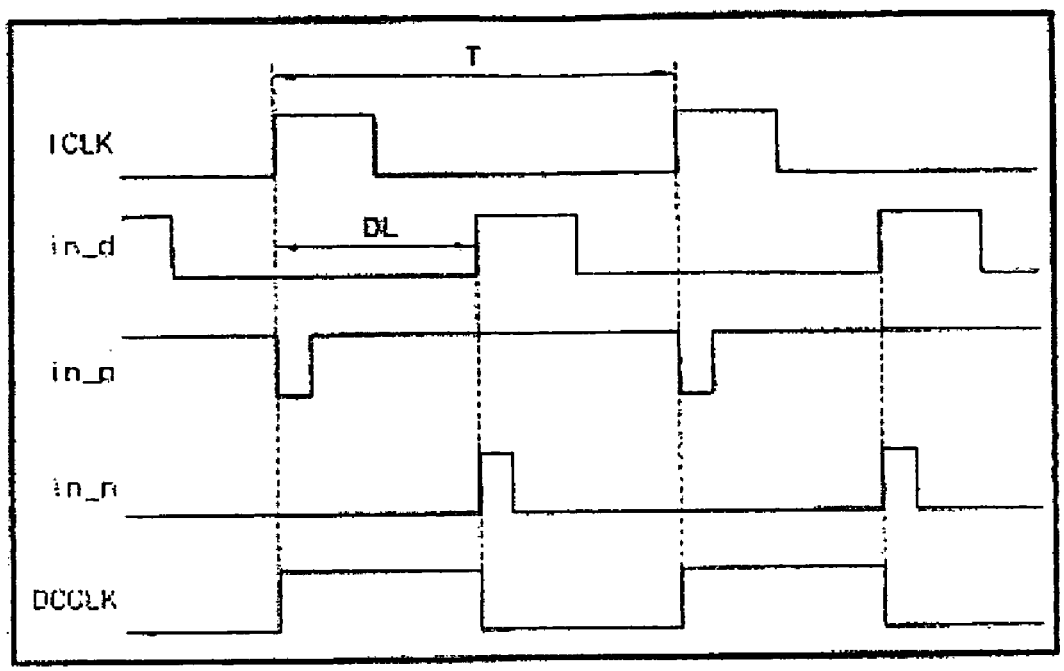
FIG. 5 is a set of signal diagrams that illustrate exemplary operations of the DCC circuit of FIG. 4, in accordance with some embodiments of the present invention.

FIG. 5 is a set of signal diagrams that illustrate exemplary operations of the DCC circuit 132 in accordance with some embodiments of the present invention. As shown in FIG. 5, the input clock signal ICLK has a duty cycle of less than 50%. The first pulse generator circuit generates a pulse IN_p responsive to the rising edge of the input clock signal ICLK to generate a rising edge transition in the DCCLK signal. The delay control circuit 134a generates a delay control signal DACC that is used to drive the adjustable delay line circuit 210. The adjustable delay line circuit 210 generates a delayed version of the input clock signal ICLK as signal IN_d such that the rising edge of the signal IN_d is at about the midpoint in the period T of the input clock signal. The second pulse generator circuit 230 generates the second driver input signal IN_n responsive to the rising edge of the signal IN_d to generate a trailing edge transition in the DCCLK signal. The latch circuit 240 maintains the state of the DCCLK signal until the driver circuit 250 generates a state transition in the DCCLK signal.

Figure 6:
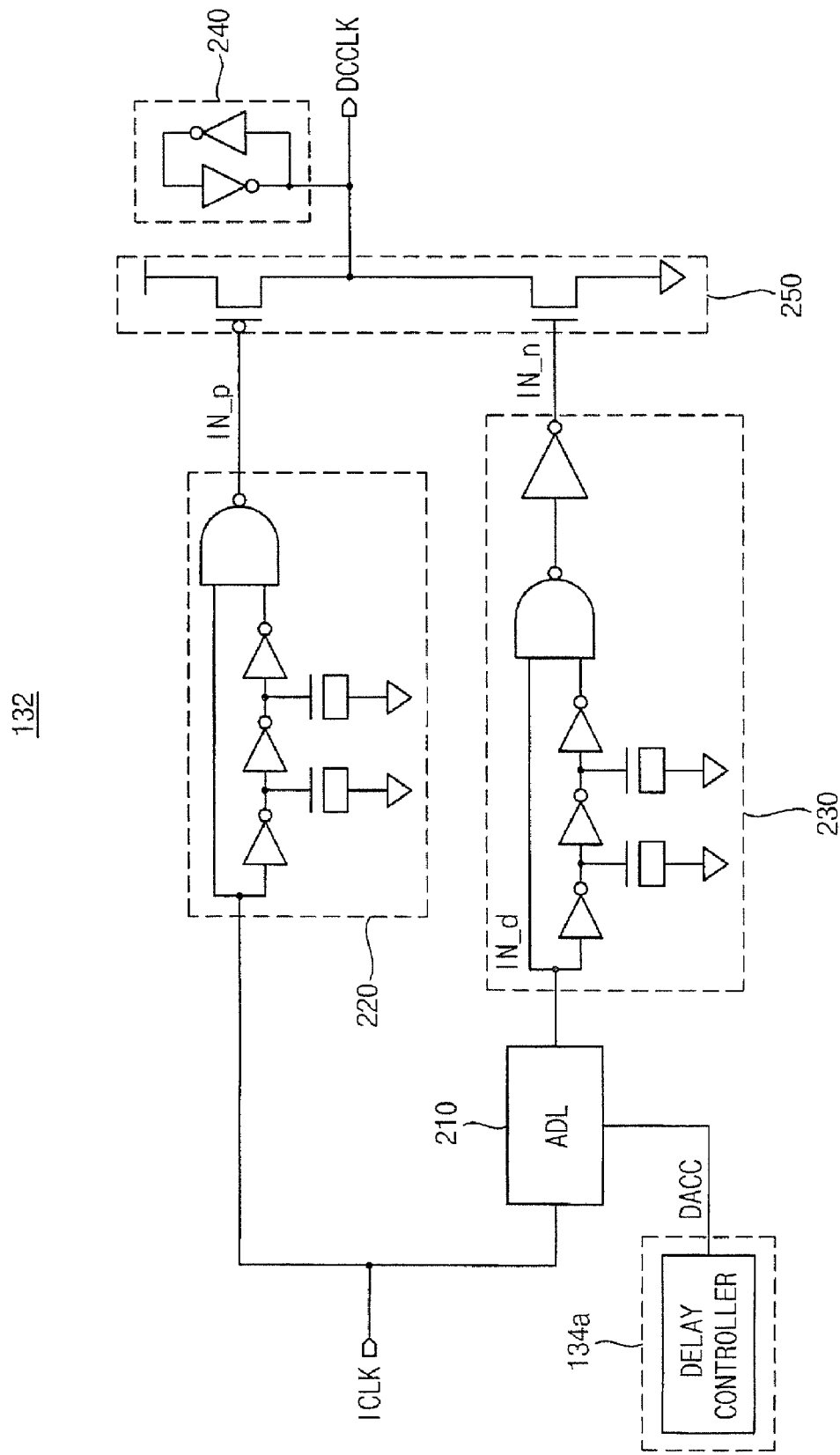
FIG. 6 is a circuit diagram that illustrates details of the first and second pulse generator circuits along with the latch circuit of FIG. 4; in accordance with some embodiments of the present invention.

FIG. 6 is a circuit diagram that illustrates further details of the first and second pulse generator circuits 220 and 230 along with the latch circuit 240 of FIG. 4. As shown in FIG. 6, the first and second pulse generator circuits 220 and 230 may be implemented using a logic circuit comprising inverters, capacitors, and a NAND gate, which are configured as shown. The latch circuit 240 may be implemented using a pair of cross-coupled inverters as shown.

Figure 7:
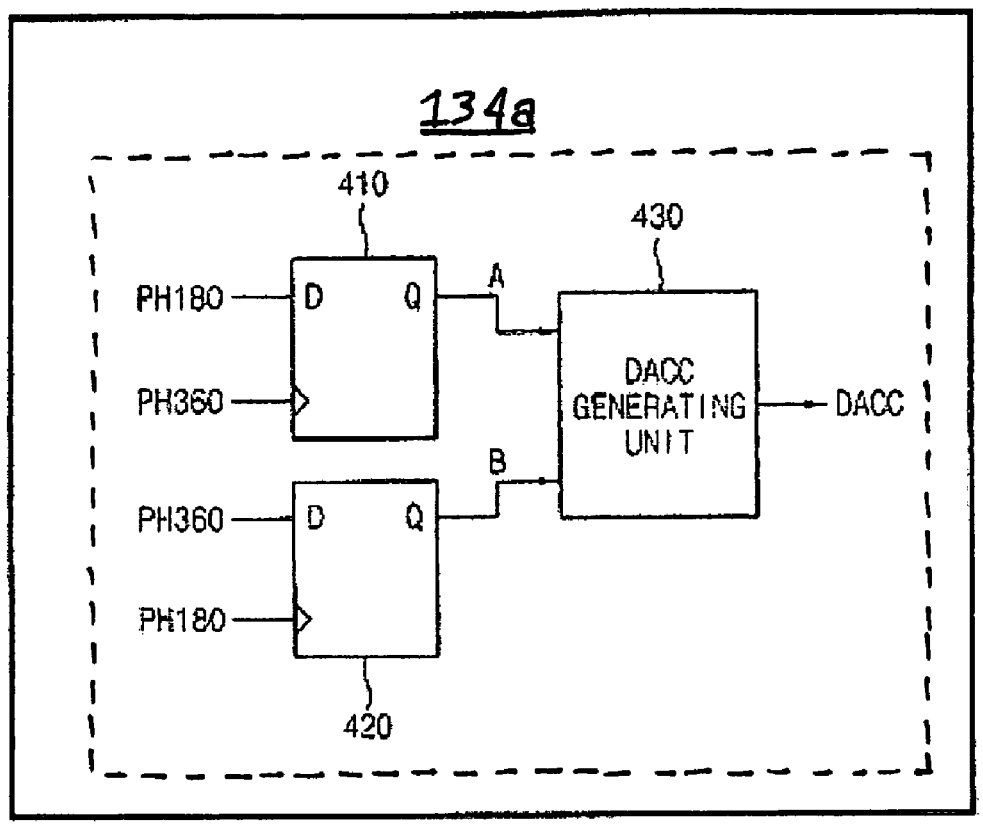
FIG. 7 is a circuit diagram that illustrates the delay control unit of FIG. 6, in accordance with some embodiments of the present invention.

FIG. 7 is a circuit diagram that illustrates the delay control unit 134a of FIG. 6 in accordance with some embodiments of the present invention. Referring to FIG. 7, the delay control unit 134a includes a first D-flip flop 410, a second D-flip flop 420 and a delay control signal generator circuit 430, which are configured as shown. The first flip flop 410 is responsive to a 180 degree phase shifted version (PH180) of the input clock signal ICLK at the D input thereof and is responsive to a 360 degree phase shifted version (PH360) of the input clock signal ICLK at the clock input thereof. The second flip flop 420 is responsive to a 360 degree phase shifted version (PH360) of the input clock signal ICLK at the D input thereof and is responsive to a 180 degree phase shifted version (PH180) of the input clock signal ICLK at the clock input thereof. The phase shifted versions of the input clock signal ICLK may be obtained, in some embodiments, from the adjustable delay line circuit 210 of FIG. 6. The delay control signal generator circuit 430 is configured to generate the delay control signal responsive to the outputs of the flip flops 410 and 420. It will be understood that although two flip flops 410 and 420 are shown in FIG. 7, a single flip flop circuit or more than two flip flop circuits may be used in accordance with other embodiments of the present invention.

Figure 8:
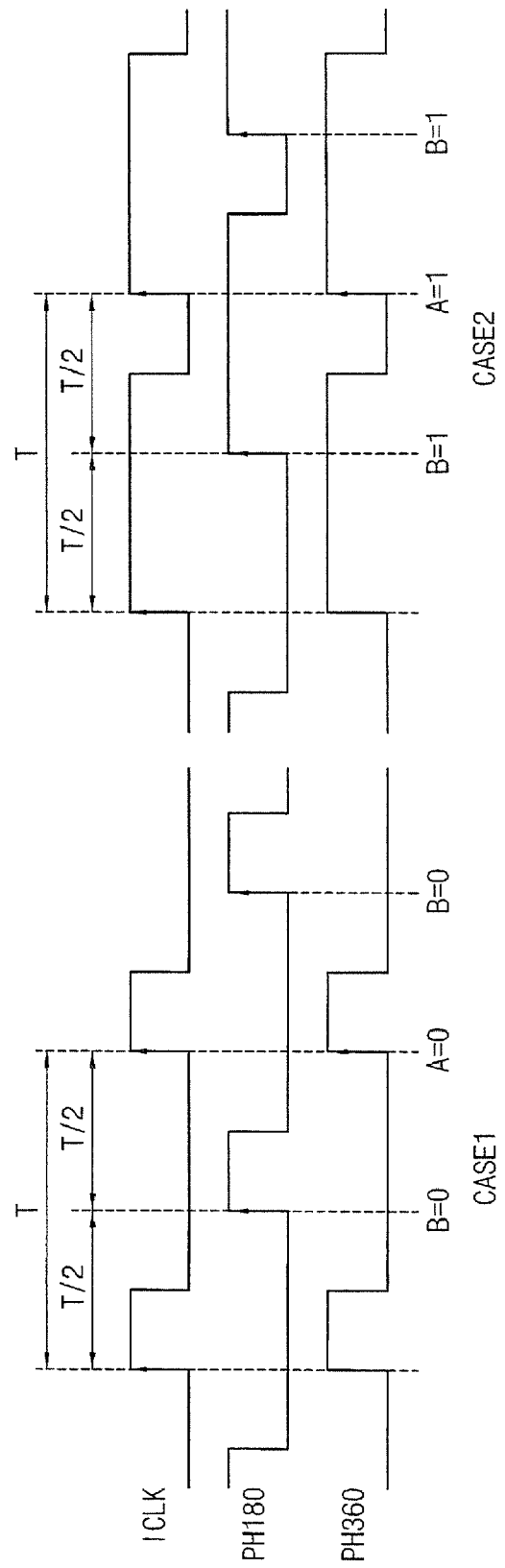
FIG. 8 is a set of signal diagrams that illustrate exemplary operations of the delay control unit of FIGS. 6 and 7, in accordance with some embodiments of the present invention.

FIG. 8 is a set of signal diagrams that illustrate exemplary operations of the delay control unit 134a of FIGS. 6 and 7 in accordance with some embodiments of the present invention. Referring to FIGS. 7 and 8, Case 1 illustrates an example in which the signal PH180 lags the signal PH360. In this example, the duty cycle ratio is less than 50% and both A and B are logic low. As a result, the delay control signal generator circuit 430 generates an output signal DACC to add delay in the adjustable delay line circuit 210 of FIG. 6. Case 2 illustrates an example in which the signal PH180 leads the signal PH360. In this example, the duty cycle ratio is greater than 50% and both A and B are logic high. As a result, the delay control signal generator circuit 430 generates an output signal DACC to reduce delay in the adjustable delay line circuit 210 of FIG. 6. As discussed above, additional flip flop circuits may be used in the delay control unit 134a to provide additional logic inputs to the delay control signal generator circuit 430. The delay control signal generator circuit 430 may process these additional logic inputs as a truth table to decide whether to generate a signal DACC that causes the delay to be reduced or increased in the adjustable delay line circuit 210 of FIG. 6. In some embodiments of the present invention, the delay control signal generator circuit 430 may be implemented as an up-down counter responsive to, for example, the outputs of one or more flip flop circuits.

In other embodiments of the present invention, the adjustable delay line circuit 210 along with the delay control unit 134a may be replaced with a conventional DLL circuit. As understood by those of skill in the art, conventional DLL circuits traditionally include an adjustable delay line therein.

Figure 9:
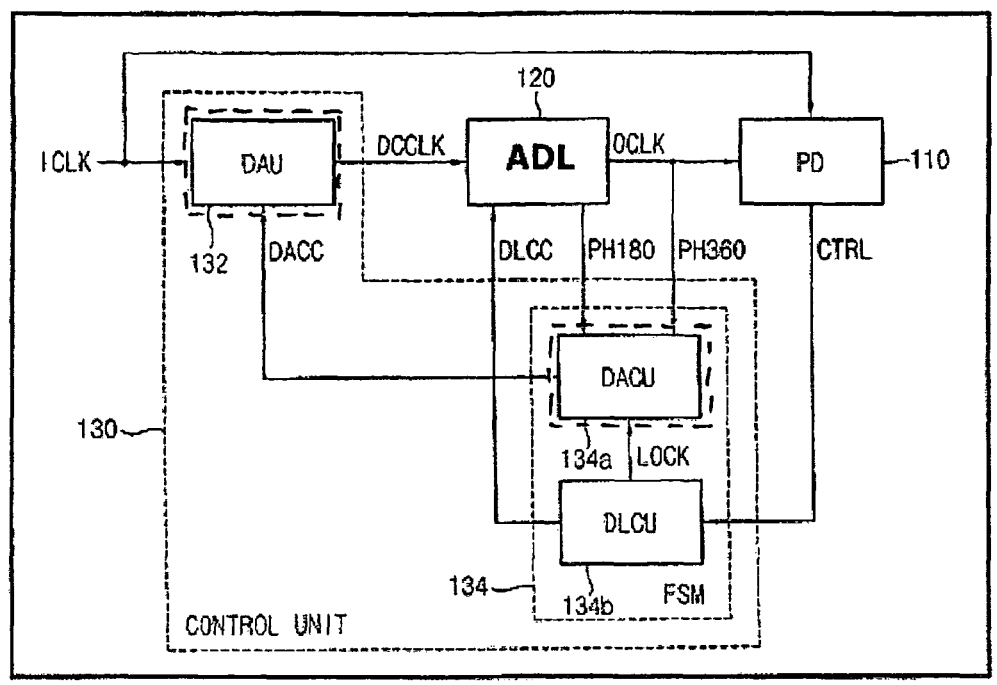
FIGS. 9 and 10 are block diagrams that illustrate clock circuits, such as DLL circuits, that incorporate a DCC/DAU unit in accordance with some embodiments of the present invention.

FIG. 9 is a block diagram that illustrates a clock circuit, such as a DLL circuit, that incorporates a DCC/DAU unit in accordance with some embodiments of the present invention. As shown in FIG. 9, the DLL circuit includes a DAU circuit 132 as described above with reference to FIG. 4, which generates a duty cycle corrected signal/clock DCCLK in response to an input signal/clock ICLK. The DLL circuit further includes an adjustable delay line circuit 120, a phase detector circuit 110, and a delay control unit 134, which are configured as shown. The delay control unit 134 includes a duty adjust control unit 134a, which may be embodied as the delay control unit 134a described above with respect to FIG. 7. The delay control unit 134 further includes a delay control unit 134b module that is configured to generate a delay control signal DLCC for driving the adjustable delay line 120 based on the detected phase difference as embodied by the CTRL signal output from the phase detector circuit 110. The delay control unit 134a may operate responsive to a LOCK signal output from the delay control unit 134b, i.e., when the DLL circuit has achieved delay lock status.

Figure 10:
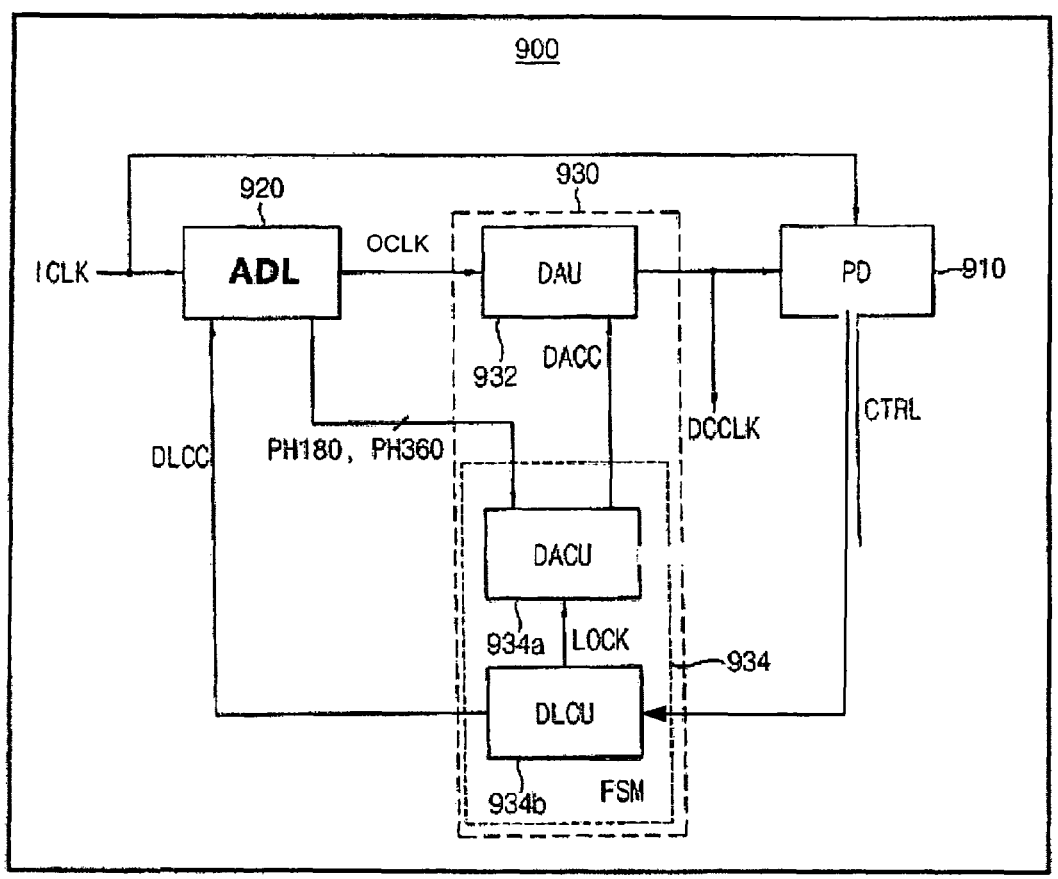

FIG. 10 is a block diagram that illustrates a clock circuit, such as a DLL circuit, that incorporates a DCC/DAU unit in accordance with further embodiments of the present invention. The adjustable delay line 920, DAU 932, phase detector 910, delay control unit 934a, and delay control unit 934b may be embodied in the same way as their corresponding modules described above with respect to FIG. 9. The combination of the DAU 932 and delay control unit 934 may be viewed as a control unit 930. A difference between the clock circuit 900 of FIG. 10 and the clock circuit of FIG. 9 is that the adjustable delay line 120 receives the input signal/clock ICLK and generates a delayed output clock signal OCLK, which is used as the input for the DAU circuit 932.

Figure 11:
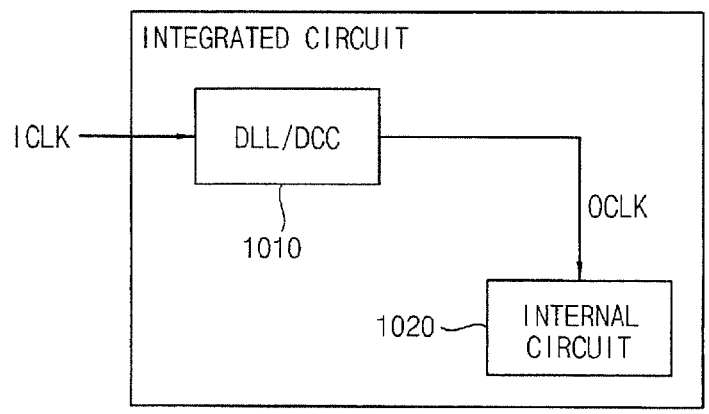
FIG. 11 is a block diagram that illustrates an integrated circuit device, such as an integrated circuit memory device, that incorporates a DLL/DCC circuit in accordance with some embodiments of the present invention.

FIG. 11 is a block diagram that illustrates an integrated circuit device, such as an integrated circuit memory device, that incorporates a DLL/DCC circuit in accordance with some embodiments of the present invention. As shown in FIG. 11, the DLL/DCC circuit 1010 may include a DCC circuit 132, such as that described above with reference to FIG. 4, which generates an output clock signal OCLK responsive to an input clock signal ICLK to drive an internal circuit 1020.

Figure 12:
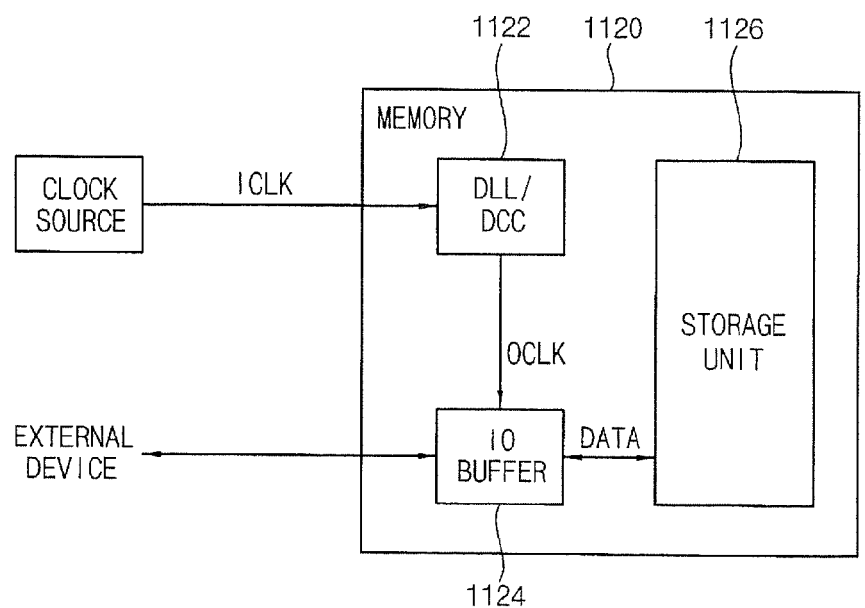
FIGS. 12 and 13 are block diagrams that illustrate systems that incorporate a DLL/DCC circuit in accordance with some embodiments of the present invention.

FIG. 12 is a block diagram that illustrates a system that incorporates a DLL/DCC circuit in accordance with some embodiments of the present invention. As shown in FIG. 12, a memory 1120 includes a DLL/DCC circuit 1122 that may include a DCC circuit 132, such as that described above with reference to FIG. 4, which generates an output clock signal OCLK responsive to an input clock signal ICLK to drive an I/O buffer 1124. The I/O buffer 1124 is used to transfer data between a storage unit 1126 and an external device. In some embodiments, the memory 1120 may be a double data rate memory device.

Figure 13:
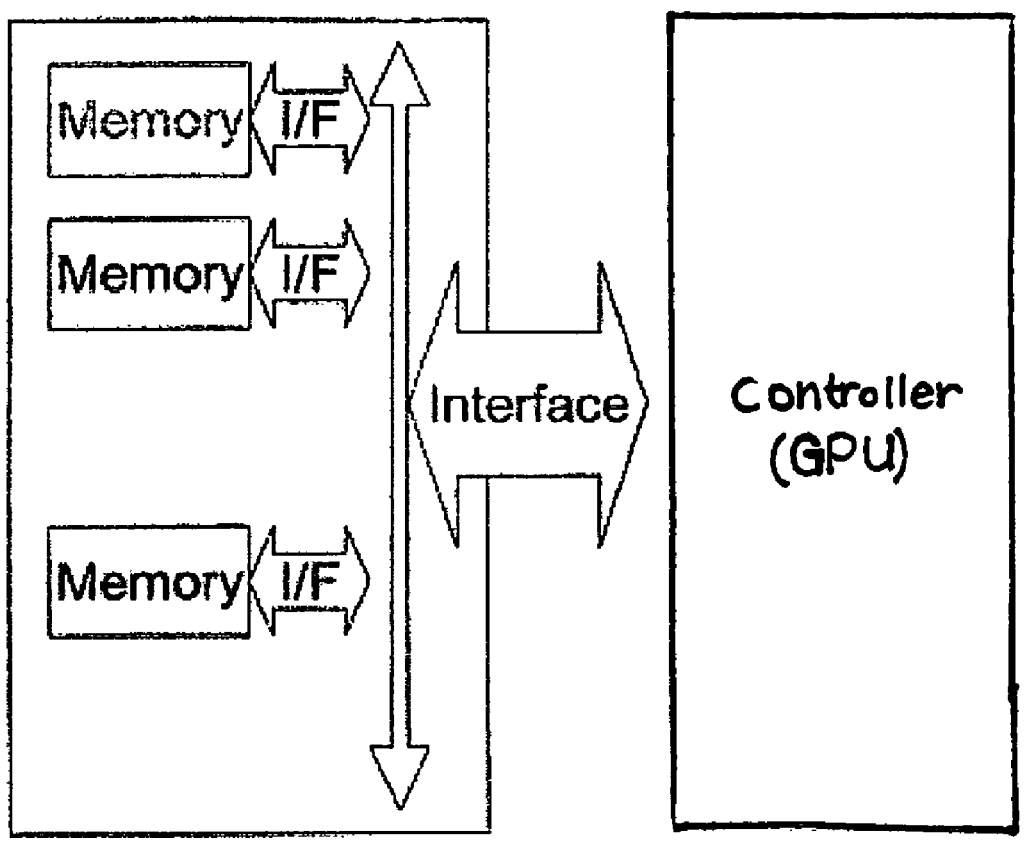

FIG. 13 is a block diagram that illustrates a system that incorporates a DLL/DCC circuit in accordance with some embodiments of the present invention. The system includes a controller that is coupled to at least one integrated circuit device via an interface. One or more of the integrated circuit devices may include a DCC circuit 132, such as that described above with reference to FIG. 4. In accordance with various embodiments of the present invention, one or more of the integrated circuit devices may be an integrated circuit memory device and/or a double data rate memory device. In further embodiments, the system may comprise a graphics card, a computer, and/or a mobile terminal.

Embodiments of the present invention may provide a DCC/DAU circuit that can be used, for example, in a DLL circuit. The DCC/DAU circuit may have a relatively small intrinsic delay, may use relatively simple control hardware, and may occupy a relatively small amount of chip area. Accordingly, the DCC/DAU circuit, according to some embodiments of the present invention, may be used in relatively high frequency DLL circuits. Moreover, the DCC/DAU circuit may provide flexibility in generating various duty ratios, including 50%: 50%.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A method of operating a duty cycle correction circuit, comprising:
   maintaining a state of a duty cycle corrected signal;
   generating a first transition in the state of the duty cycle corrected signal responsive to an input signal;
   generating a second transition in the state of the duty cycle corrected signal responsive to a delayed version of the input signal;
   generating a delay control signal responsive to a plurality of phase-shifted versions of the input signal using a plurality of delay flip-flops; and
   generating a delayed version of the input signal using a delay locked loop circuit responsive to the delay control signal;
   wherein a first one of the plurality of delay flip-flops is responsive to a first one of the plurality of phase shifted versions of the input signal at a data input thereof and is responsive to a second one of the plurality of phase shifted versions of the input signal at a clock input thereof; and
   wherein a second one of the plurality of flip-flops is responsive to the second one of the plurality of phase shifted versions of the input signal at a data input thereof and is responsive to the first one of the plurality of phase shifted versions of the input signal at a clock input thereof.

2. The method of claim 1, wherein generating the first transition comprises:
   generating a first driver input signal responsive to the input signal; and
   wherein generating the second transition comprises:
   generating a second driver input signal responsive to the delayed version of the input signal.

3. The method of claim 2, wherein generating the first transition further comprises:
   changing the state of the duty cycle corrected signal responsive to the first driver input signal; and
   wherein generating the second transition comprises:
   changing the state of the duty cycle corrected signal responsive to the second driver input signal.

4. A method of operating a clock circuit, comprising:
   maintaining a state of a duty cycle corrected signal;
   generating a first transition in the state of the duty cycle corrected signal responsive to an input clock signal;

generating a second transition in the state of the duty cycle corrected signal responsive to a delayed version of the input clock signal;

generating a delay control signal responsive to a plurality of phase-shifted versions of the duty cycle corrected signal using a plurality of delay flip-flops;

delaying the duty cycle corrected signal to generate an output clock signal; and determining a phase difference between the output clock signal and the input clock signal;

wherein the delayed version of the input clock signal is generated using a delay locked loop circuit responsive to the delay control signal;

wherein a first one of the plurality of delay flip-flops is responsive to a first one of the plurality of phase shifted versions of the duty cycle corrected signal at a data input thereof and is responsive to a second one of the plurality of phase shifted versions of the duty cycle corrected signal at a clock input thereof; and wherein a second one of the plurality of flip-flops is responsive to the second one of the plurality of phase shifted versions of the duty cycle corrected signal at a data input thereof and is responsive to the first one of the plurality of phase shifted versions of the duty cycle corrected signal at a clock input thereof; and wherein the duty cycle corrected signal is delayed based on the determined phase difference to generate the output clock signal.

5. The method of claim 4, wherein generating the first transition comprises:

generating a first driver input signal responsive to the input clock signal; and wherein generating the second transition comprises:

generating a second driver input signal responsive to the delayed version of the input clock signal.

6. The method of claim 5, wherein generating the first transition further comprises:

changing the state of the duty cycle corrected signal responsive to the first driver input signal; and wherein generating the second transition comprises:

changing the state of the duty cycle corrected signal responsive to the second driver input signal.

7. A method of operating a clock circuit, comprising:

delaying an input clock signal to generate an output clock signal;

maintaining a state of a duty cycle corrected signal;

generating a first transition in the state of the duty cycle corrected signal responsive to the output clock signal;

generating a second transition in the state of the duty cycle corrected signal responsive to a delayed version of the output clock signal;

generating a delay control signal responsive to a plurality of phase-shifted versions of the input clock signal using a plurality of delay flip-flops; and determining a phase difference between the duty cycle corrected signal and the input clock signal;

wherein the input clock signal is delayed using a delay locked loop circuit responsive to the delay control signal;

wherein a first one of the plurality of delay flip-flops is responsive to a first one of the plurality of phase shifted versions of the input clock signal at a data input thereof and is responsive to a second one of the plurality of phase shifted versions of the input clock signal at a clock input thereof;

wherein a second one of the plurality of flip-flops is responsive to the second one of the plurality of phase shifted versions of the input clock signal at a data input thereof and is responsive to the first one of the plurality of phase shifted versions of the input clock signal at a clock input thereof; and wherein the input clock signal is delayed based on the determined phase difference to generate the output clock signal.

8. The method of claim 7, wherein generating the first transition comprises:

generating a first driver input signal responsive to the output clock signal; and wherein generating the second transition comprises:

generating a second driver input signal responsive to the delayed version of the output clock signal.

9. The method of claim 8, wherein generating the first transition further comprises:

changing the state of the duty cycle corrected signal responsive to the first driver input signal; and wherein generating the second transition comprises:

changing the state of the duty cycle corrected signal responsive to the second driver input signal.

10. A duty cycle correction circuit, comprising:

a latch that is configured to maintain a state of a duty cycle corrected signal;

a transition generator circuit that is configured to generate a first transition in the state of the duty cycle corrected signal responsive to an input signal, and to generate a second transition in the state of the duty cycle corrected signal responsive to a delayed version of the input signal;

a delay control circuit that is configured to generate a delay control signal responsive to a plurality of phase-shifted versions of the input signal; and an adjustable delay line circuit that is configured to generate the delayed version of the input signal responsive to the delay control signal;

wherein the delay control circuit comprises a plurality of delay flip-flops;

wherein a first one of the plurality of delay flip-flops is responsive to a first one of the plurality of phase shifted versions of the input signal at a data input thereof and is responsive to a second one of the plurality of phase shifted versions of the input signal at a clock input thereof; and wherein a second one of the plurality of flip-flops is responsive to the second one of the plurality of phase shifted versions of the input signal at a data input thereof and is responsive to the first one of the plurality of phase shifted versions of the input signal at a clock input thereof.

11. The duty cycle correction circuit of claim 10, wherein the transition generator circuit comprises:

a first pulse generator circuit that is configured to generate a first driver input signal responsive to the input signal; and a second pulse generator circuit that is configured to generate a second driver input signal responsive to the delayed version of the input signal.

12. The duty cycle correction circuit of claim 11, further comprising:

a driver circuit that is configured to generate the first transition in the state of the duty cycle corrected signal responsive to the first driver input signal, and to generate the second transition in the state of the duty cycle corrected signal responsive to the second driver input signal.

13. The duty cycle correction circuit of claim 10, wherein the delay control circuit comprises:
 a delay flip-flop that is responsive to a first one of the plurality of phase shifted versions of the input signal at a data input thereof and is responsive to a second one of the plurality of phase shifted versions of the input signal at a clock input thereof; and
 a delay control signal generator circuit that is configured to generate the delay control signal responsive to an output of the delay flip-flop.

14. The duty cycle correction circuit of claim 10,
 wherein the delay control signal generator circuit is further configured to generate the delay control signal responsive to the output of the first delay flip-flop and an output of the second delay flip-flop.

15. A clock circuit, comprising:
 a latch that is configured to maintain a state of a duty cycle corrected signal;
 a transition generator circuit that is configured to generate a first transition in the state of the duty cycle corrected signal responsive to an input clock signal, and to generate a second transition in the state of the duty cycle corrected signal responsive to a delayed version of the input clock signal;
 an adjustable delay line that is configured to delay the duty cycle corrected signal to generate a duty cycle corrected output clock signal;
 a phase detector circuit that is configured to determine a phase difference between the duty cycle corrected output clock signal and the input clock signal; and
 a delayed locked loop circuit that is configured to generate the delayed version of the input clock signal responsive to the input clock signal;
 wherein the adjustable delay line comprises a plurality of delay flip-flops;
 wherein a first one of the plurality of delay flip-flops is responsive to a first one of the plurality of phase shifted versions of the duty cycle corrected signal at a data input thereof and is responsive to a second one of the plurality of phase shifted versions of the duty cycle corrected signal at a clock input thereof;
 wherein a second one of the plurality of flip-flops is responsive to the second one of the plurality of phase shifted versions of the duty cycle corrected signal at a data input thereof and is responsive to the first one of the plurality of phase shifted versions of the duty cycle corrected signal at a clock input thereof; and
 wherein the duty cycle corrected signal is delayed based on the determined phase difference to generate the duty cycle corrected output clock signal.

16. A clock circuit, comprising:
 an adjustable delay line that is configured to delay an input clock signal to generate an output clock signal;
 a latch that is configured to maintain a state of a duty cycle corrected output clock signal;
 a transition generator circuit that is configured to generate a first transition in the state of the duty cycle corrected output clock signal responsive to the output clock signal, and to generate a second transition in the state of the duty cycle corrected output clock signal responsive to a delayed version of the output clock signal;
 a phase detector circuit that is configured to determine a phase difference between the duty cycle corrected output clock signal and the input clock signal; and
 a delayed locked loop circuit that is configured to generate the delayed version of the input clock signal responsive to the input clock signal;
 wherein the adjustable delay line comprises a plurality of delay flip-flops;
 wherein a first one of the plurality of delay flip-flops is responsive to a first one of the plurality of phase shifted versions of the input clock signal at a data input thereof and is responsive to a second one of the plurality of phase shifted versions of the input clock signal at a clock input thereof;
 wherein a second one of the plurality of flip-flops is responsive to the second one of the plurality of phase shifted versions of the input clock signal at a data input thereof and is responsive to the first one of the plurality of phase shifted versions of the input clock signal at a clock input thereof; and
 wherein the input clock signal is delayed based on the determined phase difference to generate the output clock signal.

17. An integrated circuit device, comprising:
 a clock circuit, comprising:
  a latch that is configured to maintain a state of a duty cycle corrected clock signal; and
  a transition generator circuit that is configured to generate a first transition in the state of the duty cycle corrected clock signal responsive to an input clock signal, and to generate a second transition in the state of the duty cycle corrected clock signal responsive to a delayed version of the input clock signal;
 a delay control circuit that is configured to generate a delay control signal responsive to a plurality of phase-shifted versions of the input clock signal; and
 an adjustable delay line circuit that is configured to generate the delayed version of the input clock signal responsive to the delay control signal;
 wherein the delay control circuit comprises a plurality of delay flip-flops;
 wherein a first one of the plurality of delay flip-flops is responsive to a first one of the plurality of phase shifted versions of the input clock signal at a data input thereof and is responsive to a second one of the plurality of phase shifted versions of the input clock signal at a clock input thereof;
 wherein a second one of the plurality of flip-flops is responsive to the second one of the plurality of phase shifted versions of the input clock signal at a data input thereof and is responsive to the first one of the plurality of phase shifted versions of the input clock signal at a clock input thereof; and
 an internal circuit that is responsive to the duty cycle corrected clock signal.

18. The integrated circuit device of claim 17, wherein the integrated circuit device is an integrated circuit memory device.

19. A system, comprising:
 a clock source that is configured to generate an input clock signal;
 a delayed locked loop circuit that is configured to generate the delayed version of the input clock signal responsive to the input clock signal; and
 a memory device comprising:
  a clock circuit, comprising:
   a latch that is configured to maintain a state of a duty cycle corrected clock signal; and
   a transition generator circuit that is configured to generate a first transition in the state of the duty cycle corrected clock signal responsive to the input clock signal, and to generate a second transition in the state of the duty cycle corrected clock signal responsive to the delayed version of the input clock signal;

a delay control circuit that is configured to generate a delay control signal responsive to a plurality of phase-shifted versions of the input clock signal; and an adjustable delay line circuit that is configured to generate the delayed version of the input clock signal responsive to the delay control signal;

wherein the delay control circuit comprises a plurality of delay flip-flops;

wherein a first one of the plurality of delay flip-flops is responsive to a first one of the plurality of phase shifted versions of the input clock signal at a data input thereof and is responsive to a second one of the plurality of phase shifted versions of the input clock signal at a clock input thereof;

wherein a second one of the plurality of flip-flops is responsive to the second one of the plurality of phase shifted versions of the input clock signal at a data input thereof and is responsive to the first one of the plurality of phase shifted versions of the input clock signal at a clock input thereof;

a data storage unit; and an input/output circuit that is configured to transfer data between the data storage unit and an external device responsive to the duty cycle corrected clock signal.

20. The system of claim 19, wherein the memory device is a double data rate memory device.

21. A system, comprising:

a controller circuit; and at least one integrated circuit device connected to the controller circuit, the at least one integrated circuit device comprising:

a clock circuit, comprising:

a latch that is configured to maintain a state of a duty cycle corrected clock signal;

a transition generator circuit that is configured to generate a first transition in the state of the duty cycle corrected clock signal responsive to an input clock signal, and to generate a second transition in the state of the duty cycle corrected clock signal responsive to a delayed version of the input clock signal; and a delay control circuit that is configured to generate a delay control signal responsive to a plurality of phase-shifted versions of the input clock signal; and an adjustable delay line circuit that is configured to generate the delayed version of the input clock signal responsive to the delay control signal;

wherein the delay control circuit comprises a plurality of delay flip-flops;

wherein a first one of the plurality of delay flip-flops is responsive to a first one of the plurality of phase shifted versions of the input clock signal at a data input thereof and is responsive to a second one of the plurality of phase shifted versions of the input clock signal at a clock input thereof;

wherein a second one of the plurality of flip-flops is responsive to the second one of the pluralit of hase shifted versions of the input clock signal at a data input thereof and is responsive to the first one of the plurality of phase shifted versions of the input clock signal at a clock input thereof.

22. The system of claim 21, wherein the at least one integrated circuit device is an integrated circuit memory device.

23. The system of claim 20, wherein the memory device is a double data rate memory device.

24. The system of claim 21, wherein the system comprises a graphics card, a computer, and/or a mobile terminal.

25. A system, comprising:

a plurality of integrated circuit devices, at least one of the integrated circuit devices comprising:

a clock circuit, comprising:

a latch that is configured to maintain a state of a duty cycle corrected clock signal;

a transition generator circuit that is configured to generate a first transition in the state of the duty cycle corrected clock signal responsive to an input clock signal, and to generate a second transition in the state of the duty cycle corrected clock signal responsive to a delayed version of the input clock signal; and a delay control circuit that is configured to generate a delay control signal responsive to a plurality of phase-shifted versions of the input clock signal; and an adjustable delay line circuit that is configured to generate the delayed version of the input clock signal responsive to the delay control signal;

wherein the delay control circuit comprises a plurality of delay flip-flops;

wherein a first one of the plurality of delay flip-flops is responsive to a first thereof and is responsive to a second one of the plurality of phase shifted versions of the input clock signal at a clock input thereof;

wherein a second one of the plurality of flip-flops is responsive to the second one of the plurality of phase shifted versions of the input clock signal at a data input thereof and is responsive to the first one of the plurality of phase shifted versions of the input clock signal at a clock input thereof.

26. The system of claim 25, wherein the system is a memory module and the at least one of the integrated circuit devices is a memory device.

27. The system of claim 26, wherein the memory device is a double data rate memory device.

* * * * *

UNITED STATES PATENT AND TRADEMARK OFFICE
CERTIFICATE OF CORRECTION

PATENT NO. : 7,839,193 B2
APPLICATION NO. : 12/112225
DATED : November 23, 2010
INVENTOR(S) : Yeo et al.

It is certified that error appears in the above-identified patent and that said Letters Patent is hereby corrected as shown below:

On Title Page:
Item (73) Assignee: Please correct to read
-- Samsung Electronics Co., Ltd, Gyeonggi-do (KR); and
POSTECH Academy-Industry Foundation, Gyeongsangbuk-do
(KR) --

Signed and Sealed this
Twelfth Day of June, 2012

David J. Kappos
*Director of the United States Patent and Trademark Office*